(12) United States Patent
Rinne

(10) Patent No.: US 7,032,806 B2
(45) Date of Patent: Apr. 25, 2006

(54) METHODS OF POSITIONING COMPONENTS USING LIQUID PRIME MOVERS AND RELATED STRUCTURES

(75) Inventor: Glenn A. Rinne, Apex, NC (US)

(73) Assignee: Unitive Electronics, Inc., Durham, NC (US)

( * ) Notice: Subject to any disclaimer, the term of this patent is extended or adjusted under 35 U.S.C. 154(b) by 554 days.

(21) Appl. No.: 10/008,466

(22) Filed: Nov. 9, 2001

(65) Prior Publication Data

US 2002/0153092 A1 Oct. 24, 2002

Related U.S. Application Data

(60) Provisional application No. 60/246,899, filed on Nov. 10, 2000, and provisional application No. 60/314,240, filed on Aug. 22, 2001.

(51) Int. Cl.
*B23K 31/02* (2006.01)
*B23K 31/00* (2006.01)

(52) U.S. Cl. .................................. 228/180.22; 228/175
(58) Field of Classification Search .............. 228/111.5, 228/175, 223, 180.22; 156/273.3, 330, 379.8
See application file for complete search history.

(56) References Cited

U.S. PATENT DOCUMENTS

| | | | | |
|---|---|---|---|---|
| 4,415,811 A | | 11/1983 | Beck et al. ................. 250/560 |
| 4,496,416 A | * | 1/1985 | Machler et al. ............. 156/293 |
| 5,381,946 A | * | 1/1995 | Koopman et al. ........... 228/254 |
| 5,738,753 A | * | 4/1998 | Schwar et al. ............ 156/379.8 |
| 6,393,171 B1 | * | 5/2002 | Sasaki et al. ................. 385/14 |
| 6,410,415 B1 | * | 6/2002 | Estes et al. ................. 438/612 |
| 6,439,898 B1 | * | 8/2002 | Chua et al. .................... 439/81 |
| 6,544,376 B1 | * | 4/2003 | Takemoto et al. ....... 156/273.3 |
| 6,666,368 B1 | * | 12/2003 | Rinne ..................... 228/180.22 |
| 6,761,302 B1 | * | 7/2004 | Kaneyama ................ 228/111.5 |
| 2002/0172969 A1 | * | 11/2002 | Burns et al. .................... 435/6 |
| 2004/0108364 A1 | * | 6/2004 | Ference et al. ........ 228/180.22 |
| 2004/0110452 A1 | * | 6/2004 | Incera et al. ................... 451/54 |

FOREIGN PATENT DOCUMENTS

| | | |
|---|---|---|
| DE | 197 13 785 A1 | 10/1998 |
| EP | 0 595 343 A2 | 5/1994 |
| EP | 0 880 118 A2 | 11/1998 |
| EP | 0939583 A2 | 9/1999 |
| FR | 2 738 338 | 3/1997 |
| WO | WO 98/53946 | 12/1998 |

OTHER PUBLICATIONS

A. Powell et al. , Mechanism of Motion of an Optical Fiber Aligned by a Solder Droplet, Mat. Res.Soc. Symp. Proc. vol. 531 pp. 95–100 (1998) Materials Research Society.*
A. Powell et al; *Mechanism of Motion of an Optical Fiber Aligned by a Solder Droplet*; Mat. Res. Soc. Symp. Proc. vol. 531 pp 95–100 (1998) Materials Research Society.
*Effect of Temperature on Surface Tension*; Intelligent Systems Laboratory, Michigan State University, 1999 pp 1–2.
Ki–Chang Song et al; *Micromachined Silicon Optical Bench for the Low Cost Optical Module*.
Phillip G. Wapner et al; *Utilization of surface tension and wettability in the design and operation of microsensors*; Sensors and Actuators B71 (2000) pp 60–67.

(Continued)

*Primary Examiner*—Lynne R. Edmondson
(74) *Attorney, Agent, or Firm*—Myers Bigel Sibley & Sajovec

(57) ABSTRACT

A liquid prime mover can be used to position a component on a substrate. For example, a liquid material can be provided on the substrate adjacent the component such that the component has a first position relative to the substrate. A property of the liquid material can then be changed to move the component from the first position relative to the substrate to a second position relative to the substrate. Related structures are also discussed.

34 Claims, 12 Drawing Sheets

OTHER PUBLICATIONS

R.R.A. Syms et al; *Improving yield, accuracy and complexity in surface tension self-assembled MOEMS*; Sensors and Actuators A 88 (2001) pp 273–283.

Junghoon Lee et al; *Surface–Tension–Driven Microactuation Based on Continuous Electrowetting*; Journal of Microelectromechanical Systems, vol. 9, No. 2, Jun. 2000, pp 171–180.

Junghoon Lee et al; *Microactuation by Continous Electrowetting Phenomenon and Silicon Deep RIE Process*.

Copy of Annex to Form PCT/ISA/206 of Partial International Search Report for PCT/US01/47517.

International Search Report for PCT/US 01/47517; Date of Mailing Dec. 10, 2002.

* cited by examiner

METHODS OF POSITIONING COMPONENTS USING LIQUID PRIME MOVERS AND RELATED STRUCTURES

RELATED APPLICATIONS

The present application claims priority from Provisional Application No. 60/246,899 entitled "*Methods, Structures, And Apparatus For Surface Constrained Hydrostatic Prime Movers To Effect The Static, Dynamic, And Active Positioning Of Components*" filed Nov. 10, 2000, and from Provisional Application No. 60/314,240 entitled "*Liquid Surface Geometry Adjustment By Variation Of Surface Tension*" filed Aug. 22, 2001. The disclosures of Provisional Application Nos. 60/246,899 and 60/314,240 are hereby incorporated herein in their entirety by reference.

BACKGROUND OF THE INVENTION

Solder is used as an adhesive to attach optical fibers to a circuit board. Efforts to model the motion of an optical fiber during the wetting and solidification of the adhesive solder droplet are discussed in a reference by Adam Powell et al. entitled "*Mechanism Of Motion Of An Optical Fiber Aligned By A Solder Droplet*", Mat.Res.Soc.Symp.Proc., Vol. 531, 1998. The extent of motion is determined by several competing forces, during three stages of solder joint formation. First, capillary forces of the liquid phase control the fiber position. Second, during solidification, the presence of the liquid-solid-vapor triple line as well as a reduced liquid solder volume leads to a change in the net capillary force on the optical fiber. Finally, the solidification front itself impinges on the fiber. Publicly-available finite element models are used to calculate the time-dependent position of the solidification front and shape of the free surface.

Unfortunately, during the melting and solidification of the solder, significant motion of the fiber is observed to occur, decreasing the transmission efficiency. Because the capillary force on the fiber scales as its diameter and its stiffness as its diameter cubed, a very thin fiber is likely to be significantly deflected by the capillary force. Furthermore, as the solid joint solidifies, its volume changes, and with it the shape of the liquid surface and the magnitude of the capillary force on the fiber. Finally, as the solidified solder makes contact with the fiber, the shrinkage during cooling pulls the fiber further out of alignment. The disclosure of the Adam Powell reference is hereby incorporated herein in its entirety by reference.

SUMMARY OF THE INVENTION

According to aspects of the present invention, a component can be positioned on a substrate by providing a liquid material on the substrate adjacent the component such that the component has a first position relative to the substrate. A property of the liquid material can then be changed to move the component from the first position relative to the substrate to a second position relative to the substrate.

According to additional aspects of the present invention, an initial volume of a liquid can be provided on a wettable area of the substrate adjacent the component such that the component has a first position relative to the substrate. The volume of the liquid on the wettable area of the substrate adjacent the component can be changed to move the component from the first position relative to the substrate to a second position relative to the substrate. In addition, the component can then be secured in the second position relative to the substrate.

According to further aspects of the present invention, a liquid material can be provided on a substrate adjacent a component wherein the liquid material is confined to a wettable area of the substrate such that the component is in a first position relative to the substrate. The liquid material can then be differentially heated to move the component from the first position to a second position relative to the substrate.

Still further aspects of the present invention can provide manipulation of a light path between two optical components. For example, a liquid material can be provided on a wettable area of a substrate so that the liquid material forms a bump on the wettable area. A height of the liquid bump can be changed between a first height and a second height so that the liquid bump interrupts the light path at the first height of the liquid bump and so that the light path is not interrupted at the second height of the liquid bump.

Additional aspects of the present invention can provide optical structures. For example, first and second elongate liquid bumps can be provided on a substrate wherein the first and second elongate liquid bumps are parallel, and an optical fiber can be provided in contact with and between the first and second elongate liquid bumps. Alternatively, first and second optical components can define an optical path therebetween, and a liquid bump between the first and second optical components can be adapted to selectively interrupt and allow the optical path between the first and second optical components.

DETAILED DESCRIPTION

Figure 1A:
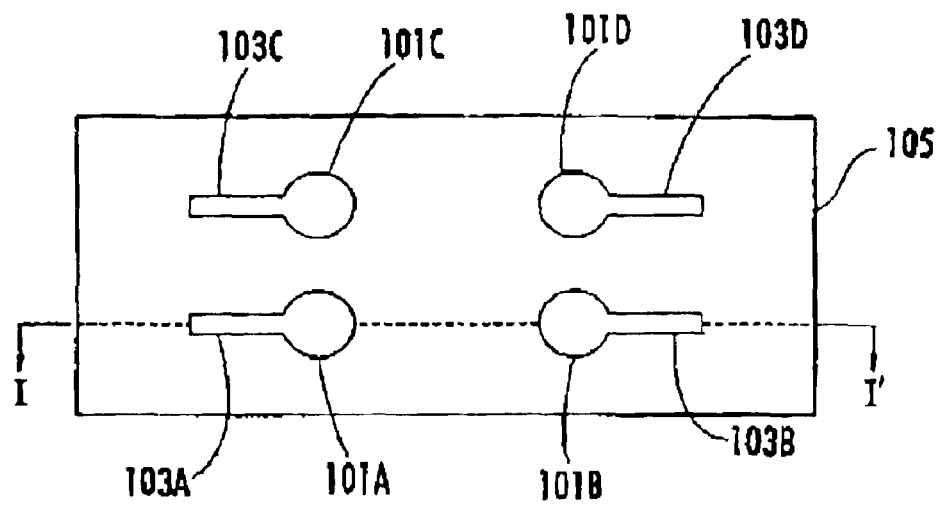
FIGS. 1A–C are plan and cross-sectional views illustrating vertical displacement of components by changing liquid volumes according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "bonded" to another element, it can be directly bonded to the other element or intervening elements may be present. In contrast, when an element is referred to as being "directly bonded" to another element, there are no intervening elements present.

According to embodiments of the present invention, a component such as an optical fiber, a lens, a laser, a light emitting diode, an integrated circuit device, and/or a microelectronic, micro-mechanical, and/or micro-optical device can be precisely positioned on a substrate by changing a property of a liquid material adjacent the component. More particularly, a liquid material can be provided on the substrate adjacent the component such that the component has a first position relative to the substrate. A property of the liquid material can then be changed while maintaining the liquid material as a liquid to move the component from the first position relative to the substrate to a second position relative to the substrate.

For example, a high degree of precision and small movements may be desired for alignment of an optical component on an optical module substrate, and a rigid locking or clamping mechanism may be desired to maintain the alignment of the component once achieved. Materials that can transition in phase from a liquid or fluid-like state (referred to hereinafter as liquid) to a rigid state are well suited to provide alignment of the component in the liquid state and then to secure the component in the aligned position in the rigid state. Examples of such materials include solder, thermoplastics, UV-curable epoxies, snap-cure epoxies, and others.

Figure 1B:
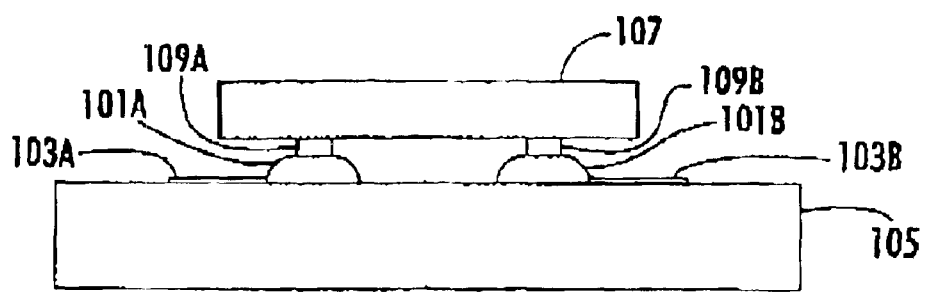
Figure 1C:
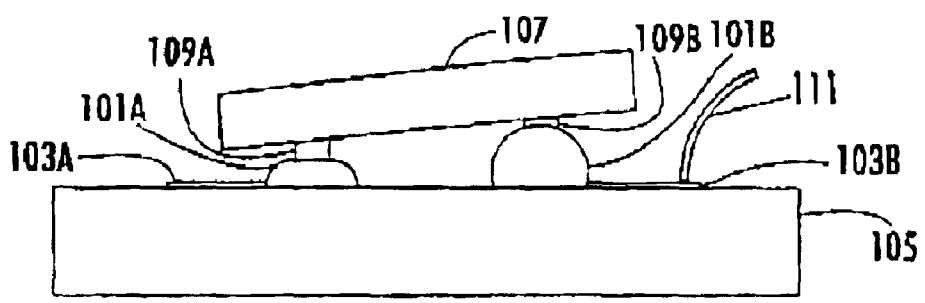

To effect movement of the component for alignment, a liquid prime mover can be used. Since the attachment or clamping material is in the liquid state during the positioning phase, the internal pressure caused by the surface tension of the liquid can be used as a prime mover. As shown in FIGS. 1A–C, for example, one or more molten (liquid) solder bumps 101A–D could be increased in volume by adding solder to the bump. Solder can be added to one or more of the solder bumps 101A–D, for example, by feeding a solder wire into a relatively narrow feeder portion 103A–D such that the new solder flows to the respective bump 101A–D upon melting and the larger bump causes the component 107 on the bumps to rotate. Three such bumps under the component could define a plane and, thus, control total height and angular orientation of the component 107 relative to the substrate 105. Note that the bumps need not have a circular base, but can be any shape useful for a particular application (e.g., oblong, rectangular, triangular).

As shown in FIG. 1A, a substrate 105 can include one or more solder bumps 101A–D used to secure a component 105 to the substrate, and one or more of the solder bumps can have an associated feeder portion 103A–D used to feed solder to the respective solder bump. Each of the solder bumps and associated feeder portions is formed on a wettable area of the substrate 105 and the wettable area of the substrate is used to confine the lateral dimensions of the solder bumps and feeder portions so that the solder bumps are confined to a relatively wide dimension on the substrate and so that the feeder portions are confined to relatively narrow dimensions on the substrate. Accordingly, molten solder will flow from a relatively narrow feeder portion to a respective relatively wide solder bump. The flow of molten solder from relatively narrow portions to relatively wide portions is discussed, for example, in U.S. Pat. No. 5,892,179 entitled "*Solder Bumps And Structures For Integrated Redistribution Routing Conductors*" and assigned to the assignee of the present invention. The disclosure of U.S. Pat. No. 5,892,179 is hereby incorporated herein in its entirety by reference.

As shown in cross section in FIG. 1B, a component 107 including wettable pads 109A–D corresponding to solder bumps 101A–D can be aligned with the substrate 105 using molten solder bumps 101A–D. More particularly, the wettable pads are brought into contact with the respective molten solder bumps, and the interaction of the wettable pads and the molten solder bumps will bring the component into alignment with the solder bumps. The component, however, may not have a desired alignment with respect to the substrate after initial alignment because of inaccuracies in the initial size of the solder bumps. The component, for example, may be a laser diode, and precise positioning of the laser diode may be desired to accurately project the laser output relative to the substrate.

Additional solder may be added to one or more of the feeder portions to selectively increase the size of the respective solder bump thereby raising the portion of the component adjacent to the solder bump having increased solder. As shown in FIG. 1C, additional solder from solder wire 111 can be fed through feeder portion 103B to the solder bump 101B. Because the size of solder bump 101B is increased while the size of solder bump 101A is not increased, an angular orientation of component 107 is changed relative to the substrate 105. Solder can be added to additional solder bumps to further adjust the height and/or angular orientation of the component. If the component is a laser diode, for example, the laser output can be monitored while adjusting the angular orientation thereof to obtain a desired orientation of the laser output. Once the desired orientation of the component is achieved, the molten solder bumps can be cooled to a solid state thereby securing the component to the substrate in the desired orientation.

By providing at least three solder bumps with feeder portions, the height and angular orientation of the component can be controlled relative to the substrate. While four solder bumps are illustrated in FIGS. 1A–C, as few as one solder bump with a feeder portion or more solder bumps with feeder portions can be provided according to embodiments of the present invention. Moreover, not all solder bumps according to embodiments of the present invention are required to have respective feeder portions, and it may not be necessary to provide the ability to adjust the volume of all solder bumps coupling the component to the substrate. In addition, solder may be added to solder bumps by means other than a feed wire and a feeder portion. Precise volumes of liquid solder, for example, can be jetted to a feeder portion or directly to a solder bump. Solder reservoirs and/or sumps can also be used to change the volume of a solder bump as discussed in greater detail below.

Figure 2A:
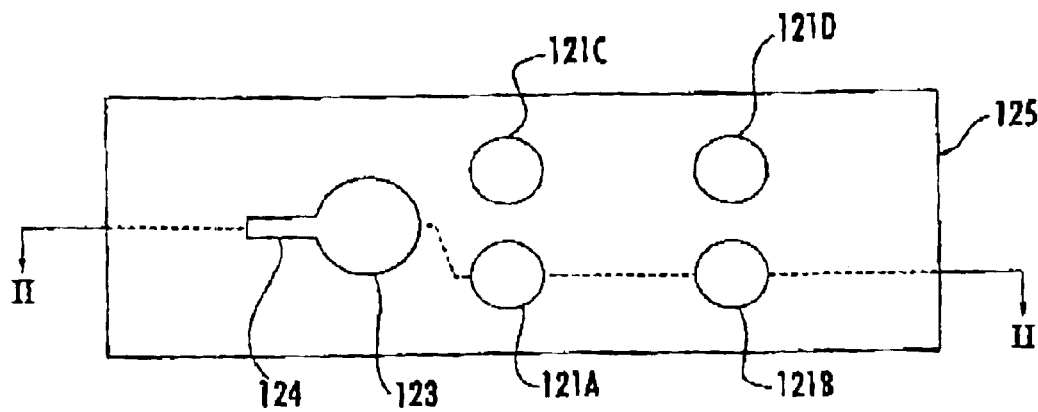
FIGS. 2A–C are plan and cross-sectional views illustrating lateral displacement of components by changing liquid volumes according to embodiments of the present invention.
Figure 2B:
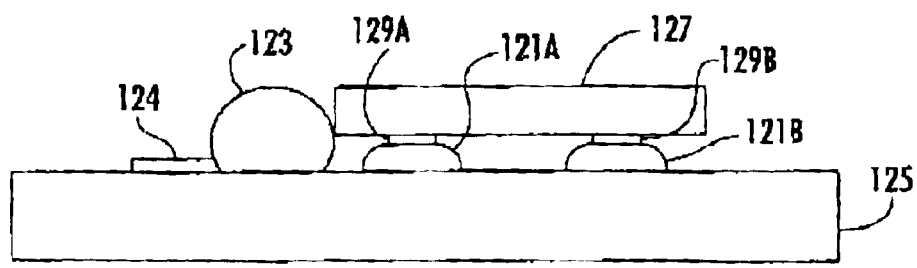
Figure 2C:
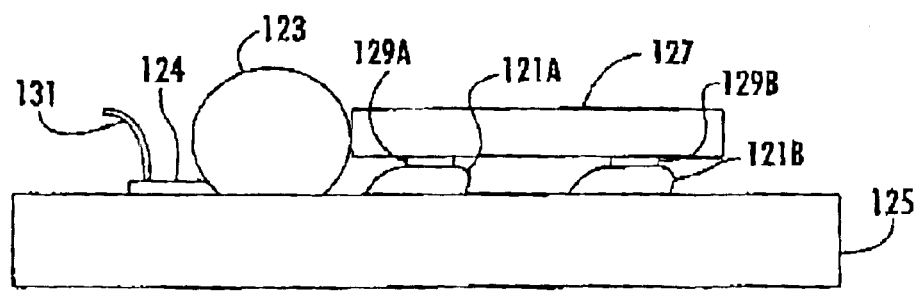

As shown in FIGS. 2A–B, a liquid prime mover can alternately be used to effect lateral movement of a component on a substrate. Solder bumps 121A–D can be provided on substrate 125 to secure a component 127. Solder bumps 121A–D can also provide an electrical coupling between the substrate and the component. Embodiments illustrated in FIGS. 2A–B can also include a prime mover such as solder bump 123 to effect lateral displacement of the component 127. A relatively narrow feeder portion 124 can be used to feed solder to the solder bump 123 thereby increasing the size of the solder bump 123 and displacing the component 127 to the right as shown in FIG. 2C.

More particularly, molten (liquid) solder bumps 121A–D can be provided between wettable pads 129A–D of the component 127 and the substrate 125. Wettable areas of the substrate 127 can be used to define the surface area of the substrate to which the bumps 121 will be confined. Surface tension of the bumps 121 will define a rough alignment of the component as discussed above with regard to FIGS. 1A–C.

Lateral alignment of the component 127 can be effected by changing a property of the bump 123. Volume can be added to the bump 123, for example, by adding material to the bump 123 through the relatively narrow feeder portion 124 thereby displacing the component 127. More particularly, the component can be positioned on molten (liquid) solder bumps 121A–D with the solder bump 123 having a first volume as shown in FIG. 2B. As long as the solder bumps 121A–D are molten (liquid), the component can be moved by adding volume to the solder bump 123, for example, by feeding solder wire 131 into the relatively narrow feeder portion 124 so that molten (liquid) solder from the wire flows to the solder bump 123 as shown in FIG. 2C. Once a desired degree of displacement has been effected, the solder bumps 121A–D can be solidified by cooling to secure the component 127 in the desired orientation relative to the substrate 125.

As discussed above, the volume of the solder bump can be changed by means other than the melting of a solder wire onto a relatively narrow feeder portion. Precise volumes of liquid solder, for example, can be jetted to a feeder portion or directly to a solder bump. Alternately, solder reservoirs and/or sumps can be used to change the volume of a solder bump. In addition, other properties of a liquid prime mover can be changed to effect movement of the component. For example, temperature, electrical potential, surface tension, differences in wettable areas, and combinations thereof can be used to manipulate a liquid prime mover as discussed in greater detail below. While a single solder bump 123 is shown to effect lateral movement of the component, a plurality of solder bumps can be provided to effect lateral movement of the component.

Moreover, aspects of embodiments illustrated in FIGS. 1A–C and 2A–C can be combined. Volume of one or more of solder bumps 121A–D of FIGS. 2A–C can be changed to adjust an angular alignment of the component 127 with respect to the substrate, while changing the volume of solder bump 123 to change a lateral displacement of the component. Moreover, liquid prime movers other than solder can be used to adjust position of the component, and properties of the liquid prime mover other than volume can be used to effect movement of the component.

Figure 3:
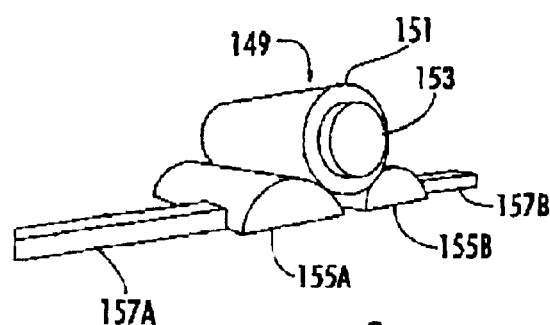
FIGS. 3 and 4A–C are perspective and cross-sectional views illustrating displacements of fibers using elongate liquid bumps according to embodiments of the present invention.

According to additional embodiments, the hydrostatic pressure of a liquid can be used as a prime mover in the positioning of non-planar components such as fibers and lenses. By changing the size or extent of a liquid bump, the pressure of the liquid can displace a component laterally as well as vertically. As shown in FIG. 3, a position of an optical fiber 149 including an outer cladding 151 and an inner core 153 can be governed by the elongate semi-cylindrical liquid bumps 155A–B provided on a substrate. The elongate liquid bumps 155A–B may be referred to as vesicles or liquid-filled sacs because the surface tension of many materials that can be used to form the elongate bumps may form a tenacious skin that acts like a bag or sac. By providing a liquid prime mover that is not wettable to the outer cladding 151 of the optical fiber 149, the optical fiber can be supported between the two elongate liquid bumps 155A–B. Once a desired position of the optical fiber 149 is achieved, the elongate liquid bumps can be solidified by cooling to secure the optical fiber in the desired position.

By way of example, the elongate bumps 155A–B can be elongate solder bumps provided on wettable contact pads of a substrate, and relatively narrow feeder portions 157A–B can be used to add solder to the respective elongate bumps 155A–B. The narrow feeder portions 157A–B are confined to respective narrow wettable contact pads of the substrate so that solder will flow from the relatively narrow feeder portions to the elongate solder bumps 155A–B. Accordingly, adding equal amounts of solder to both elongate solder bumps 155A–B can raise the optical fiber 149 vertically without significant lateral displacement. Adding more solder to one of the elongate solder bumps can displace the optical fiber laterally. As discussed above with respect to FIGS. 1A–C and 2A–C, solder can be added through the respective feeder portions 157A–B, or solder can be added directly to either of the elongate solder bumps 155A–B. Alternately, solder reservoirs and/or sumps can be used to change a volume of solder of either of the elongate solder bumps 155A–B.

Figure 4A:
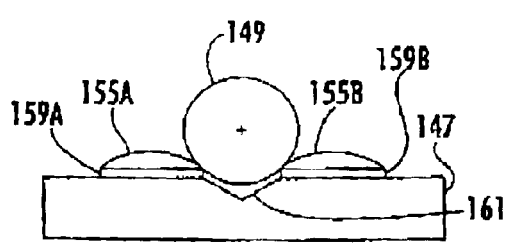
Figure 4B:
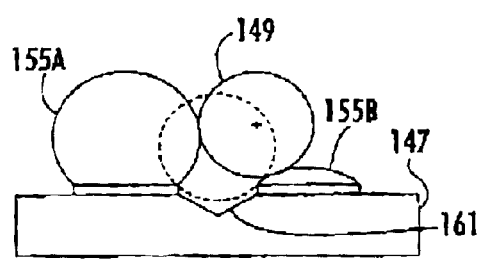
Figure 4C:
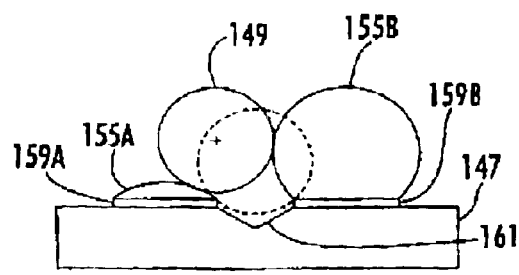
Figure 4D:
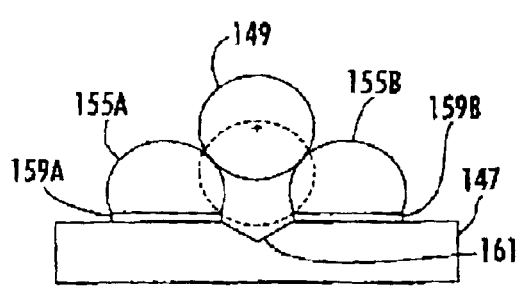

As shown in FIGS. 4A–D, elongate liquid bumps can be used to effect precise positioning of an optical fiber 149. An optical fiber 149 can be placed between two elongate liquid bumps 155A–B confined to respective wettable contact pads 155A–B of a substrate 147, as shown in FIG. 4A. An optional pre-alignment groove 161 in the substrate is shown. As additional molten (liquid) solder is added to one of the elongate pads, the volume increases and the bump grows as shown in FIGS. 4B–C. Since the liquid does not wet the optical fiber 149 surface, the fiber is forced aside. If more liquid is added to one elongate liquid bump than the other, a lateral displacement of the optical fiber 149 can be effected as shown in FIGS. 4B–C. If both elongate liquid bumps 155A–B have equal amounts of liquid added, the net motion is a vertical translation as shown in FIG. 4D.

Significant force can be generated by the relatively small elongate liquid bumps of FIGS. 3 and 4A–D. A 50 µm tall elongate solder bump on a 5 mm long 100 µm wide oblong wettable pad can exert a force of 1 gmf on an adjacent fiber. This force is sufficient to deflect a 62.5 µm diameter silica optical fiber by 1 µm.

Fibers illustrated in FIGS. 3 and 4A–D could be replaced with another non-planar component such as a lens. Alternatively, components such as lasers or diodes that are soldered to the substrate could be 'nudged' into proper position by varying the volume of adjacent liquid bumps.

As discussed above with regard to FIG. 14, the volume of a liquid bump can be increased to precisely position a component on a substrate. In various examples, molten (liquid) solder has been discussed as a liquid that could be used. Other liquid materials such as thermoplastics and epoxies, however, could be used to position components.

Figure 5:
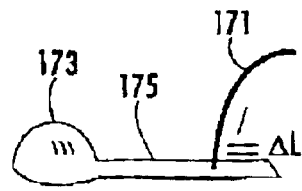
FIG. 5 is a perspective view of adding liquid to a liquid bump according to embodiments of the present invention.

When adding liquid to a bump through a relatively narrow feeder portion, the resulting volume added can be calculated as discussed below with regard to FIG. 5. While other materials can be used, solder will be discussed by way of example. As shown in FIG. 5, a thin solder wire 171 can be used to add solder to a liquid solder bump 173 through a relatively narrow feeder portion 175.

Calculation of the change in solder volume of a 5 mm long by 0.05 mm wide hemispherical solder bump 173 when a 12.5 micron (0.5 mil) diameter solder wire 171 is introduced through the relatively narrow feeder portion 175 indicates that the volume of the liquid solder bump 173 can increase 0.2% for every micron of wire 171 consumed. If 25 μm of wire is fed into the liquid solder bump 173, the radius of the bump 173 would increase by approximately 0.75 μm.

Solder could also be added to a liquid solder bump by droplets in the liquid state, as in liquid metal jetting for which picoliter drop sizes have been demonstrated. Likewise, a syringe could dispense controlled volumes of solder. It is even possible to electrochemically deposit additional solder using molten salt electrolytes in a manner similar to brush plating. Conceivably, other deposition methods could be employed such as solid preforms, powders, pastes, cremes, spheres, or vapors.

Sumps and/or predeposited solder reservoirs can also be used to adjust the volume of one or more solder bumps as illustrated in FIGS. 6A–D. As shown, an optical fiber 201 can be positioned between two elongate solder bumps 203A–B. The elongate solder bumps 203A–B are connected via wettable channels 204A–D and 214A–D also referred to as 'flumes' defined by portions of a patterned solder wettable layer 207 to reservoirs 205 and sumps 211. At the output of each reservoir 205 or sump 211 there is a flow-control dam 209 also referred to as a 'sluice'. The patterned solder wettable layer 207 defines areas within which solder bumps 203A–B, solder reservoirs 205, and sumps 211 will be confined, and solder does not flow outside the areas defined by the solder wettable layer 207 because adjacent areas of the substrate 209 are not wettable to solder.

The flow-control dams 209 comprise a non-wettable material and can thus reduce the flow of solder through the wettable channels. In an initial state illustrated in FIGS. 6B and 6D, flow-control dams 209A–D stop the flow of predeposited solder from solder reservoirs 205A–D to elongate solder bumps 203A–B, and flow control dams 213A–D stop the flow of solder from elongate solder bumps 203A–B to sumps 211A–D.

Structures illustrated in FIGS. 6A–E can thus be used to increase and/or decrease a volume of solder in the elongate solder bumps 203A–B by selectively removing flow-control dams and reflowing the solder. As discussed above, flow-control dams have a low wettability with respect to solder to stop a flow of solder through a respective wettable channel, and the flow-control dams can include materials such as metal oxide, glass, and/or a polymeric solder mask. Likewise, flow-control dams can be used to stop a flow of solder to respective sumps.

When a flow of solder past a flow-control dam is desired, the wettability of the channel at the flow-control dam can be increased. This increase in wettability can be accomplished by mechanically removing the flow-control dam such as by scratching, milling, and/or sandblasting the flow-control dam. Photomechanical techniques such as ablation, localized heating, and photo- or thermal-decomposition can also be used to remove a flow-control dam. Alternatively, chemical techniques such as etching to remove the flow-control dam or coating the flow-control dam with a lower surface energy material to improve wettability over the flow-control dam can be used. A bridge, for example, can be formed across a flow-control dam (or across a gap in the patterned wettable layer 207) by placement of a wettable fiber, droplet or channel. In addition, electrostatic and/or electromagnetic techniques could cause perturbations in the reservoir, creating waves that bridge across the flow-control dam or gap. Mechanical vibrations, thermal shocks, moving paddles, squeegees, and other means can be used to encourage movement of solder until it bridges the flow-control dam or gap. The solder could alternatively be squeezed by pressing with a plunger to force the solder to bridge the gap.

Moreover, the flow of liquid from a reservoir to a bump or from a bump to a sump can be controlled using electrowetting. A channel between a bump and a reservoir or a sump can be provided with a semi-wettable material, for example, and the wettability of the semi-wettable channel can be increased by electrically charging the liquid of the bump and/or reservoir. Alternatively or in addition, the flow of liquid from a reservoir to a bump or from a bump to a sump can be controlled using differential heating as discussed below with respect to FIGS. 12A–E, 13A–E, 15A–E, and 17A–E; or using uniform heating as discussed below with respect to FIGS. 14A–C. Meta-stable conditions can also be used to control liquid flows as discussed below with respect to FIGS. 15A–C and 17A–C.

Figure 6A:
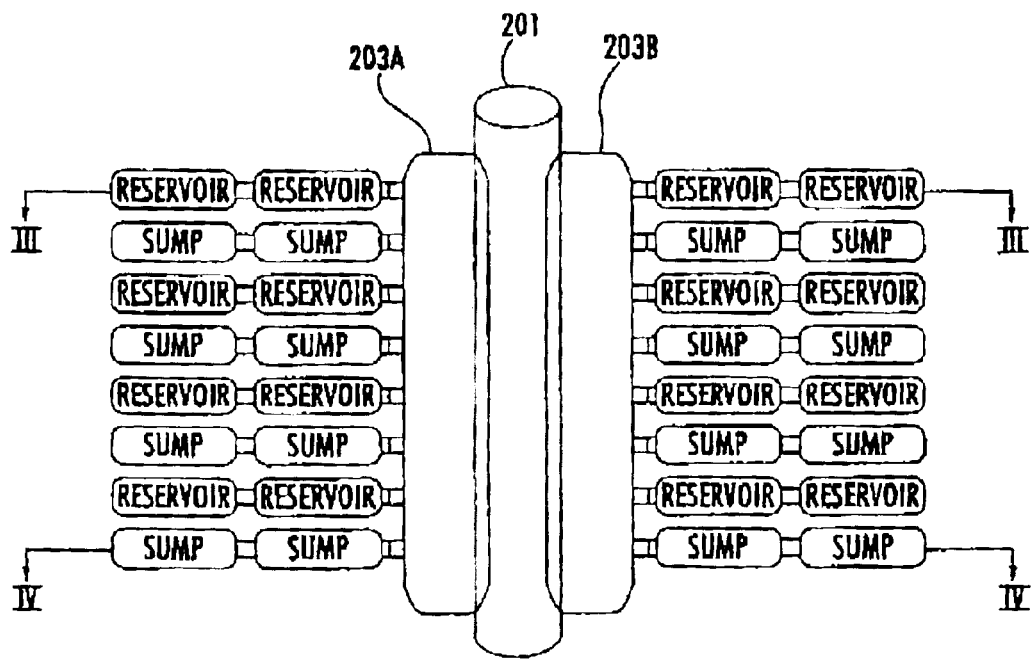
FIGS. 6A–E are plan and cross-sectional views illustrating sumps and reservoirs according to embodiments of the present invention.
Figure 6B:
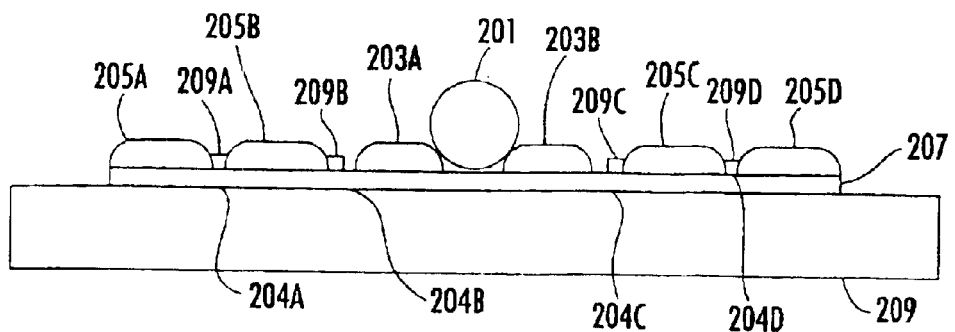
Figure 6C:
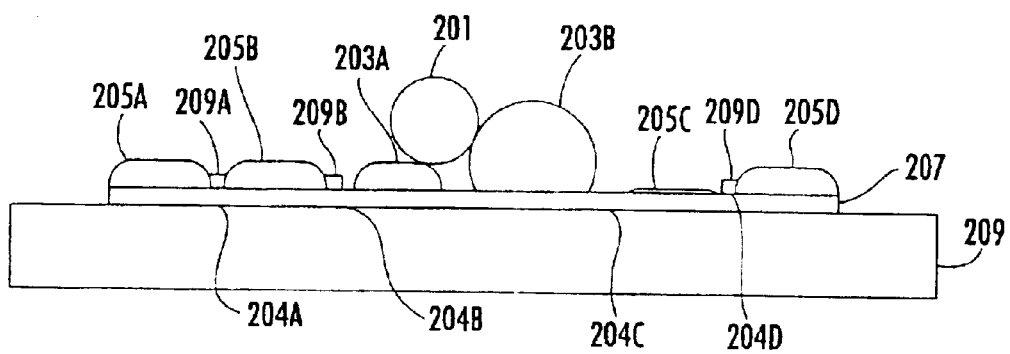

As shown in FIGS. 6A–C, a solder reservoir 205A–D can be predeposited with a volume of solder at the time the elongate solder bumps 203A–B are deposited. As shown in FIG. 6B, the optical fiber 201 is placed between the elongate solder bumps 203A–B, and if the solder is heated to its melting temperature, the flow-control dams 209A–D can stop the flow of solder from the reservoirs to the elongate solder bumps. If the optical fiber is to be laterally displaced, additional solder volume can be added to the elongate solder bump 203B to displace the optical fiber to the left as shown in FIG. 6C. More particularly, the flow-control dam 209C can be removed so that when the solder is heated to its melting temperature, solder will flow from the solder reservoir 205C to the elongate solder bump 203B due to the geometries of the elongate solder bump, the reservoir, and the wettable channel coupling the elongate solder bump 203B and the solder reservoir 205C.

More particularly, the relative widths of the portions of the solder wettable layer 207 defining the wettable channels and the solder reservoirs can be narrow relative to the width of the elongate solder bump so that molten solder flows to the wider elongate solder bump as discussed in U.S. Pat. No. 5,892,179 entitled "Solder Bumps And Structures For Integrated Redistribution Routing Conductors" and assigned to the assignee of the present invention. Any number of flow-control dams can be removed to allow the flow of solder from solder reservoirs to the respective elongate solder bump to increase the volume of the elongate solder bump by predetermined increments.

Figure 6D:
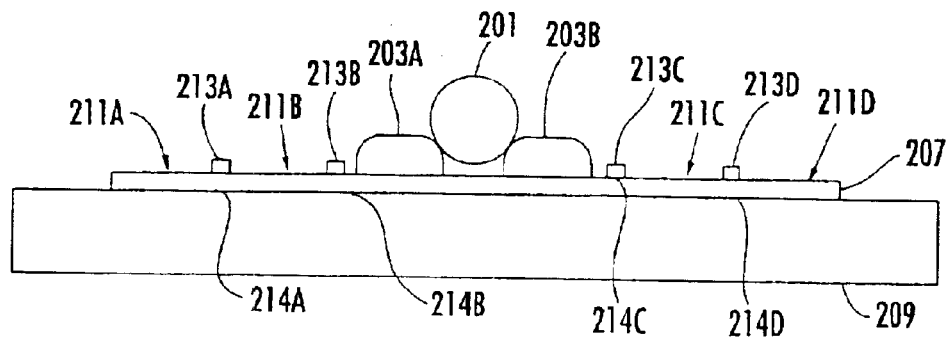
Figure 6E:
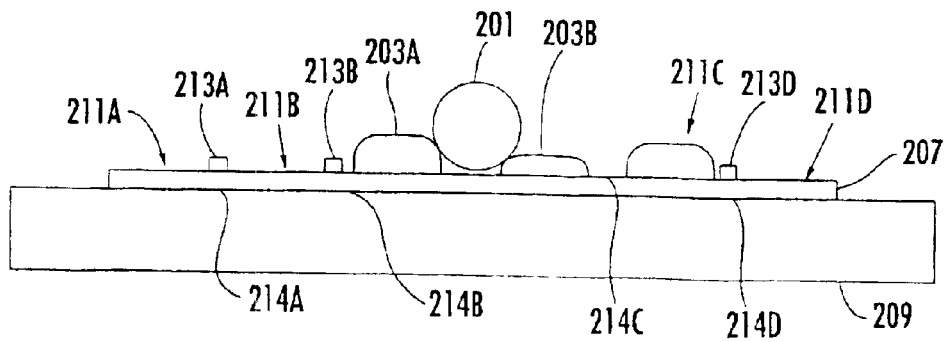

As shown in FIGS. 6A and 6D–E, little or no solder is deposited on the sumps 211A–D prior to positioning the optical fiber 201 between the elongate solder bumps 203A–B. If it is desired reduce a volume of one of the elongate solder bumps 203A–B, one or more of the flow-control dams 213A–D blocking the sumps 211A–D can be removed thereby allowing solder to flow from an elongate solder bump to one or more sumps. As shown in FIGS. 6D–E, the flow-control dam 213C between the elongate solder bump 203B and the sump 211C can be removed thus allowing solder to flow from the elongate solder bump 203B to the sump 211C. In the example of FIG. 6E, the optical fiber 201 can be laterally displaced to the right.

According to embodiments of the present invention, a sump can be designed to have a lower radius of curvature than the corresponding elongate solder bump such that the internal pressure is lower in the sump until the sump is full. While the plan view of FIG. 6A shows the sumps and reservoirs as geometrically similar, it is possible to provide different geometries for reservoirs and sumps to increase a flow of solder from a reservoir to a bump and to increase a flow of solder from a bump to a sump. A reservoir, for example, may be provided on a portion of a solder wettable layer having a relatively narrow dimension with respect to the corresponding bump to increase flow to the bump. In contrast, a sump may be provided on a portion of a solder wettable layer having a relatively wide dimension with respect to the corresponding bump to increase flow to the bump.

According to embodiments illustrated in FIGS. 6A–E, incremental operations of removing flow-control dams and reflowing solder can be used to precisely control the volumes of elongate solder bumps 203A–B. Once desired volumes of the elongate solder bumps are achieved, the solder bumps can be solidified by cooling to maintain the optical fiber in a desired position. While the sumps and reservoirs are illustrated in FIG. 6A as being provided together on a substrate, embodiments of the present invention can be implemented with only one or more reservoirs and no sumps, or with only one or more sumps and no reservoirs. Moreover, sumps and/or reservoirs of different sizes can be provided to reduce and/or increase different volumes of solder. In addition, sumps and/or reservoirs can be used to change volumes of solder in bumps having geometries other than that of the elongate bumps of FIGS. 6A–E and to position components other than optical fibers. Sumps and/or reservoirs, for example, can be used to change volumes of bumps such as those illustrated in FIGS. 1A–C and 2A–C.

Figure 7:
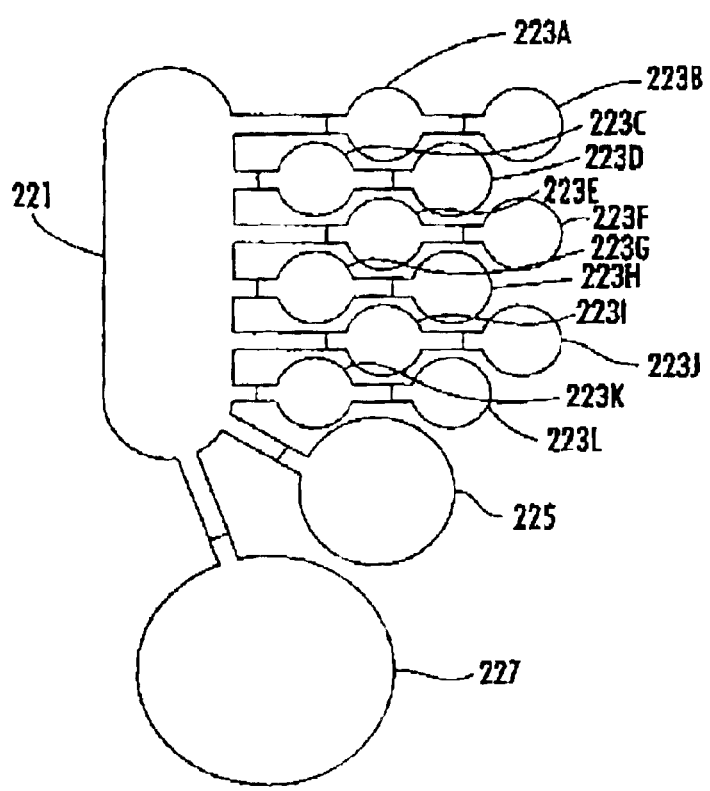
FIG. 7 is a plan view illustrating alternate examples of reservoirs according to embodiments of the present invention.

According to embodiments illustrated in FIG. 7, reservoirs of different sizes can be provided so that discrete volumes of solder can be added to the elongate solder bump 221. In the particular example of FIG. 7, the bump 221 is connected through channels to the reservoirs of differing sizes. For scale, reservoirs 223A–L can be 125 μm in diameter, reservoir 225 can be 1000 μm in diameter, and reservoir 227 can be 2500 μm in diameter. Accordingly, the radius of bump 221 can be increased over a range of 10 μm in 0.25 μm steps. Bumps and reservoirs of different sizes as illustrated in FIG. 7 can be used as prime movers in any of the embodiments illustrated in FIGS. 1A–C, 2A–C, 3, 4A–C, and/or 6A–E. Such bumps can have different geometries than the elongate bump illustrated in FIG. 7, and reservoirs with sizes and shapes different than those illustrated in FIG. 7 can be provided. Sumps of different sizes can alternately be used to provide decreases over a predetermined range in predetermined steps.

While the use of reservoirs and sumps to vary the size of a bump is discussed with reference to FIGS. 6A–E and 7 for the purpose of positioning a component, reservoirs and sumps can also be used to provide bumps of precise size without necessarily changing a position of a component. To their knowledge, the Applicant is the first to realize that solder sumps and reservoirs can be used to provide bumps of precise size.

While examples of the present invention are discussed above as including solder bumps, other liquids such as thermoplastics and epoxies can be used to position components according to embodiments of the present invention. As discussed above, a change in displacement of a component can be effected by changing a volume (size) of a liquid bump in contact with the component. For example, the surface tension of a liquid bump in contact with a component can result in a pressure exerted on the component, or an increase in a size of the liquid bump can increase a pressure exerted on the component to move the component. Similarly, a decrease in the size of a liquid bump can decreases a pressure exerted on the component to move the component in the opposite direction. While the pressure exerted by a liquid bump against a component can be increased or decreased by increasing or decreasing a size of the bump as discussed above, the pressure exerted by a bump can also be increased or decreased by changing the surface tension of the liquid bump as discussed in greater detail below. Moreover, a mere change in volume of a liquid bump can be used to displace a component.

When used as a prime mover, a liquid bump according to embodiments of the present invention can provide force to move a component using pressure resulting from surface tension. The Young-Laplace equation relates this pressure P to the surface tension γ, and the major and minor radii of curvature according to the following equation:

$$P = \gamma \cdot \left[ \frac{1}{r_1} + \frac{1}{r_2} \right]. \qquad [1]$$

A change one or more of the three variables can thus be used to change a pressure exerted by a liquid bump.

The concept of surface tension relates to an interface between two bodies. Changes in a liquid-air interface between solder and air can thus change a surface tension of the solder. Changes in solid-liquid and liquid-liquid interfaces can also be used to change a surface tension of a solder. A surface tension of a material is a function of the material with which it is in contact and the temperature. Accordingly, to vary the surface tension, either the material of the liquid bump (e.g., indium γ=592 dyne/cm has higher surface tension than either lead γ=530 dyne/cm or tin γ=480 dyne/cm) can be changed, or the material in contact with the liquid bump (e.g., tin in air γ=417 dyne/cm vs. tin in nitrogen γ=464 dyne/cm at 250° C.) can be changed, or the temperature of the liquid bump can be changed. For example, different reservoirs could contain different materials such that γ could be changed simultaneously with the volume. Since the surface of liquid metal may oxidize readily, the oxygen content of the surroundings could be controlled with addition of oxygen being used to increase γ. Similarly, an environment surrounding a liquid solder bump could be flooded with a liquid or vapor phase reductant such as acid or hydrogen, to reduce surface oxides. A liquid-liquid interface could be formed by immersion in a liquid with a high boiling point such as glycerin.

When an oxidized surface of a liquid bump is used to change a surface tension of the bump, the surface of the bump actually comprises a material (oxide) different than that of the liquid bump. Alternatively, a flexible material can be provided over an initial bump, and the bump can be used to inflate or deflate the flexible material with the addition or removal of solder.

In addition, the radius of curvature of the surface of a liquid bump (such as a molten solder bump) is a function of the amount of liquid, the wetted area on the substrate, and the wetting angle at the solder-substrate-air interface. All three of these variables can be controlled.

The wetting angle depends on the 'wettability' of the substrate. Any of the methods mentioned above to control the flow of solder in the wettable channels of FIGS. 6A–E and 7 could be used to control the wettability of the substrate.

The wetted area can be controlled much like the wettable channels as well. A solder dam around the base of the liquid bump could be moved or removed to expose more or less wettable area of the substrate to the liquid bump. A non-wettable surface covered by a wettable, removable surface is one means for reducing the wetted area. The volume of the liquid bump can be adjusted with the addition or removal of liquid as discussed above.

As discussed above, surface tension and/or pressure of liquid phase materials can be exploited as a prime mover on the millimeter and micron scale. Forces on the order of grams per sq. mm can be generated with displacements of tens of microns. Such structures may be useful for positioning of components on substrates. The present application describes methods, structures, and apparatuses for employing this mechanism on planar substrates. Techniques according to aspects of the present invention can also be used on non-planar surfaces.

Figure 8:
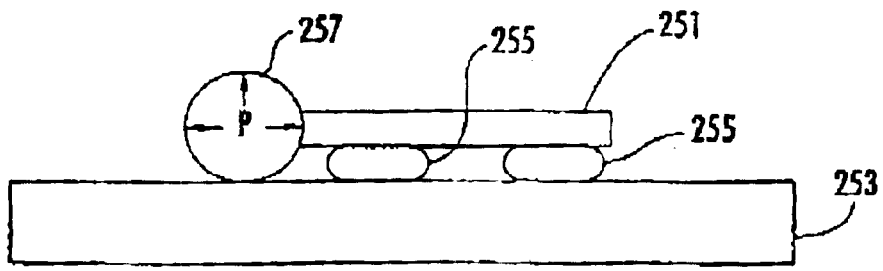
FIGS. 8–11 are cross-sectional views illustrating displacement of components using liquid bumps according to embodiments of the present invention.

The addition or removal of liquid from a liquid bump can thus be used to position a component. Other properties of a liquid bump can alternately be used to position a component. As illustrated in FIG. 8, a component 251 can be secured to a substrate 253 using an adhesive 255, and a pressure P exerted by a liquid bump 257 can be used to position the component 251. More particularly, the adhesive 255 may be in an initial liquid or fluid like state such that the component is roughly aligned yet moveable with respect to the substrate. The adhesive, for example, can be a curable epoxy in an initially uncured state or a solder in an initial molten (liquid) state. In other words, the component is flexibly secured to the substrate with the adhesive in the initial state.

By varying the pressure exerted by the liquid bump 257 on the component 251, the component can be moved laterally with respect to the substrate. As discussed above, the pressure P exerted by the liquid bump can be changed, for example, by changing a gas, liquid or other fluid environment surrounding the liquid bump; by changing an electrical potential of the liquid bump; by changing a temperature of the liquid bump; by changing a volume of the liquid bump; by allowing oxidation of a surface of the liquid bump; by removing an oxide from a surface of the liquid bump; by changing a composition of the liquid bump; and/or by changing a wetted area of the substrate for the liquid bump.

Once the desired position of the component has been achieved, the adhesive can be transformed to a rigid state to rigidly secure the component to the substrate in the desired position while maintaining the liquid bump as a liquid. Once the component is rigidly secured, the liquid bump can be allowed to solidify or the liquid bump can be removed. If the adhesive is a curable epoxy, the component can be rigidly secured by curing the epoxy adhesive while maintaining the liquid bump in the liquid state at the desired pressure. If the adhesive is a solder, the component can be rigidly secured by cooling the solder adhesive to a solid state while maintaining the liquid bump in the liquid state at the desired pressure. If both the adhesive and the liquid bump are solder, for example, separate heaters in the substrate 253 can be used to separately heat the liquid solder bump and the solder adhesive so that the solder adhesive can be cooled to solidification while maintaining the liquid bump in the liquid state at the desired pressure. While multiple adhesive areas are illustrated in FIG. 8, a single adhesive area could be used to secure the component to the substrate.

Figure 10:
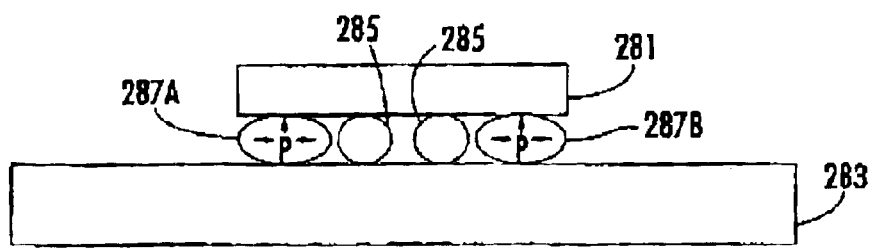

As illustrated in FIG. 10, a pressure P of liquid bumps 287A–B can be varied to adjust a vertical alignment of the component 281 with respect to the substrate 283. As discussed above with regard to FIG. 8, the pressure P exerted by the liquid bumps 287A–B can be varied, for example, by changing a gas, liquid or other fluid environment surrounding the liquid bump; by changing an electrical potential of the liquid bump; by changing a temperature of the liquid bump; by changing a volume of the liquid bump; by allowing oxidation of a surface of the liquid bump; by removing an oxide from a surface of the liquid bump; by changing a composition of the liquid bump; and/or by changing a wetted area of the substrate for the liquid bump.

The adhesive 285 can flexibly secure the component 281 to the substrate 283 while the pressures P of the liquid bumps 287A–B are varied to obtain a desired orientation of the component relative to the substrate. Once the desired orientation is achieved, the adhesive can be transformed to a rigid state to rigidly secure the component to the substrate in the desired orientation. In embodiments according to FIG. 10, the pressure of the liquid bumps 287A–B can be used to vary a vertical displacement of the component with respect to the substrate. A greater pressure of either bump 287A–B can increase a displacement of the respective portion of the component relative to the substrate, and a lesser pressure of the either bump 287A–B can decrease a displacement of the respective portion of the component relative to the substrate. The adhesive 285, for example, can be solder, epoxy, or any other material that can provide flexible and then rigid adhesion as discussed above.

Figure 9:
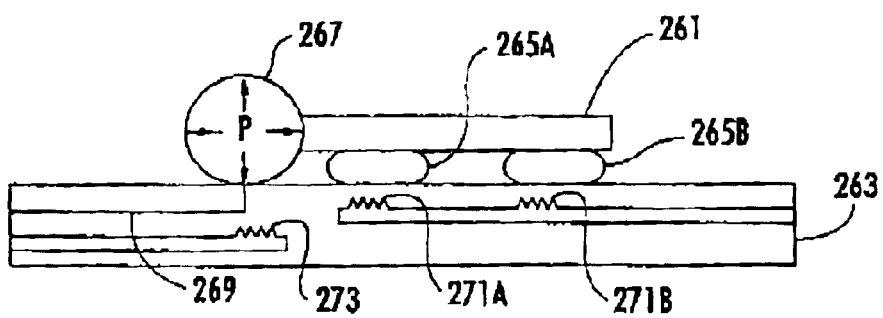

According to embodiments of the present invention illustrated in FIG. 9, component 261 can be secured to substrate 263 using solder bumps 265A–B, and positioning can be effected using solder bump 267. Moreover, solder bumps 265A–B can be heated and cooled using resistive heater elements 271A–B, while solder bump 267 can be heated and cooled independent of solder bumps 265A–B using separate resistive heater element 273. Accordingly, the solder bumps 265A–B and 267 can be heated above their respective melting temperatures with the component 261 positioned on solder bumps 265A–B and adjacent solder bump 267. Defined wettable contact areas of the component 261 and defined wettable contact areas of the substrate 263 together with the solder bumps 265A–B will provide a rough positioning of the component 261 relative to the substrate 263.

A relatively fine lateral positioning of the component 261 can be effected by changing the pressure P exerted by the solder bump 267 on the component. As shown in FIG. 9, the wire 269 can be used to apply an electrical potential to the solder bump 267 to vary the pressure P exerted by the solder bump 267 on the component 261. Alternatively or in addition, the heat applied to the solder bump 267 by the heater element 273 can be varied above the melting temperature of the solder bump 267 to vary the pressure P. Once a desired position of the component is achieved by varying the desired property or properties of the liquid solder bump 267, the heater elements 271A–B can be turned off to solidify the solder bumps 265A–B while maintaining the solder bump 267 as a liquid. Once the component 261 has been rigidly secured using solder bumps 265A–B, the solder bump 267 can be allowed to solidify by turning the heater element 273 off. Liquids other than solder can be used as the liquid prime mover of bump 267, and the liquid of bump 267 (whether solder or another liquid) does not need to be solidified. Embodiments according to FIG. 9 can alternatively be implemented using a curable epoxy for bumps 265A–B or other materials such that heater elements 271A–B are not required wherein the epoxy bumps are cured to rigidly secure the component. Other liquids such as thermoplastics could be used.

Figure 11:
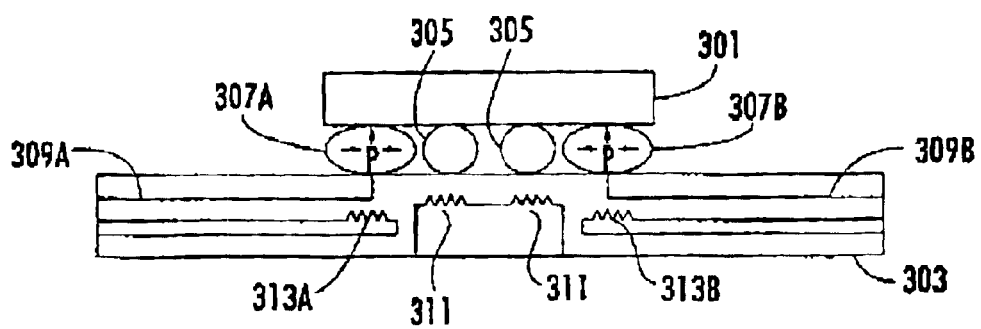
Figure 12A:
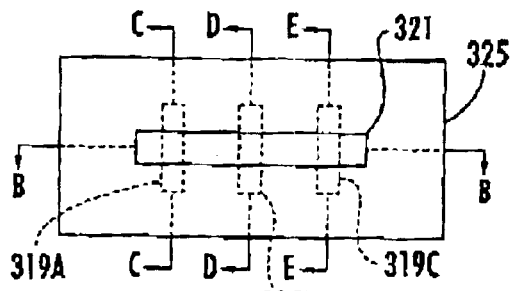
FIGS. 12A–E and 13A–E are plan and cross-sectional views illustrating movement of liquid on a constrained symmetric surface using a temperature differential across the liquid according to embodiments of the present invention.
Figure 12B:
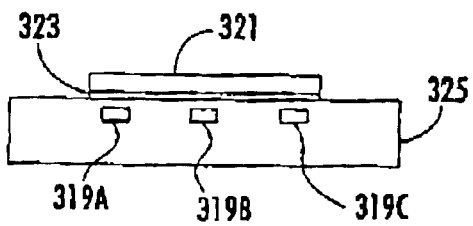
Figure 12C:
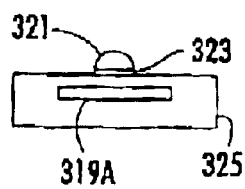
Figure 12D:
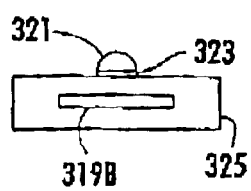
Figure 12E:
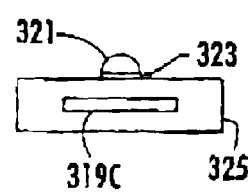
Figure 13A:
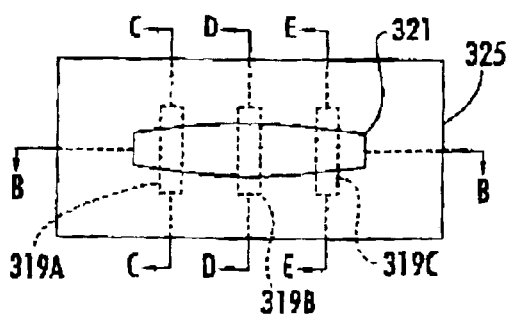
Figure 13B:
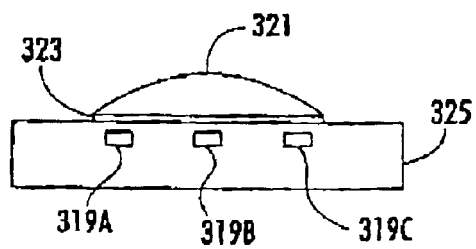
Figure 13C:
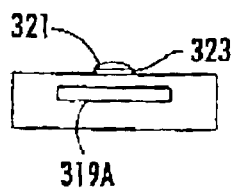
Figure 13D:
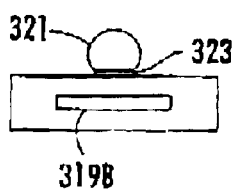
Figure 13E:
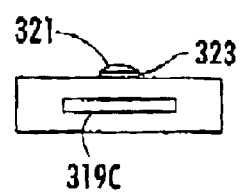

As illustrated in FIG. 11, a pressure P of liquid bumps 307A–B can be varied to adjust a vertical alignment of the component 301 with respect to the substrate 303. As discussed above with regard to FIG. 9, the pressure P exerted by the liquid bumps 307A–B can be varied by for example, by changing a gas, liquid or other fluid environment surrounding the liquid bumps; by changing an electrical potential of the liquid bumps; by changing a temperature of the liquid bumps; by changing a volume of the liquid bumps; by allowing oxidation of a surface of the liquid bumps; by removing an oxide from a surface of the liquid bumps; by changing a composition of the liquid bumps; and/or by changing a wetted area of the substrate for the liquid bumps.

The adhesive 305 can flexibly secure the component 301 to the substrate 303 while the pressures P of the liquid bumps 307A–B are varied to obtain a desired orientation of the component relative to the substrate. Once the desired orientation is achieved, the adhesive 305 can be transformed to a rigid state to rigidly secure the component 301 to the substrate 303 in the desired orientation. In embodiments according to FIG. 11, the pressure of the liquid bumps 307A–B can be used to vary a vertical displacement of the component with respect to the substrate. A greater pressure of either bump 307A–B can increase a displacement of the respective portion of the component 301 relative to the substrate, and a lesser pressure of the either bump 307A–B can decrease a displacement of the respective portion of the component 301 relative to the substrate. The adhesive 305, for example, can be solder, epoxy, or any other material that can provide flexible and then rigid adhesion as discussed above.

According to embodiments illustrated in FIG. 11, each of liquid bumps 307A–B and each of adhesive bumps 305 can be solder, with independent heater elements 309A–B being provided within substrate 303 for each solder bump 307A–B. The solder bumps 305 used for adhesion can be provided with heater elements 311 in substrate 303 that are independent of heater elements 309A–B. Accordingly, each of the solder bumps 307A–B and the solder bumps 305 can be heated above their respective melting temperatures using heater elements 311 and 313A–B to allow positioning of the component by varying the pressures P of the solder bumps 307A–B. The position of the component can be varied by varying the pressures P of one or more of solder bumps 307A–B, and when the desired position is achieved, the heater elements 311 can be turned off to solidify the solder bumps 305 to secure the component in the desired position. Once the solder bumps 305 have been solidified, the heater elements 313A–B can be turned off.

As shown in FIG. 11, separate wires 309A–B can be provided within substrate 303 to independently vary electrical potentials of the solder bumps 307A–B to independently vary the pressures P thereof. Each wire 309A–B can be coupled to a variable voltage source to vary the electrical potential of the respective bump to vary the surface tensions thereof. Alternatively, temperatures of solder bumps 307A–B can be independently varied above the melting temperature of the solder using independent heater elements 313A–B to independently vary the pressures thereof. If independent control of the pressures of solder bumps 307A–B is not required or if the pressures are varied by means other than temperature, the heater elements 313A–B need not be independent. Moreover, if an adhesive material other than solder is used for adhesive 305, the heater elements 311 need not be provided. In addition, if a property other than electrical potential is used to vary the pressures of solder bumps 307A–B, the wires 309A–B need not be provided.

According to additional embodiments of the present invention, localized heating of a liquid bump can be used to change a displacement exerted by a portion of the liquid bump on a component. Different portions of an elongate liquid bump can be heated to different temperatures using multiple heater elements to increase or decrease a pressure exerted by a portion of the elongate liquid bump. In other words, movement of liquid in a liquid bump of constant volume on an unchanging wettable area of a substrate can be effected by differentially heating portions of the liquid bump to different temperatures according to a phenomena known as thermocapillarity or the Marangoni effect.

The surface tension of a liquid is dependant on its surface free energy and the free energy of the gas or liquid with which it is in contact. These free energies are functions of temperature and electrostatic potential, among other factors. Since the equilibrium shape depends on surface tension, varying the surface tension (e.g., by locally changing the temperature as in thermocapillarity) will change the equilibrium shape. The surface energy can also be varied by the application of an electrostatic field to cause the formation of an electric double layer, as in electrowetting or electrocapillarity.

These effects can be used to create local widening or narrowing of elongate solder bumps that are constrained in two dimensions by a wettable area of a substrate surface. Local widening or narrowing of a solder bump using thermocapillarity can thus be used in positioning and alignment of components, such as optical components. Moreover, liquids other than solder can also be used.

According to embodiments illustrated in FIGS. 12A–E and 13A–E, one or more heater elements 319A–B within substrate 325 can be used to provide localized heating of an elongate solder bump 321. As shown in the top view of FIGS. 12A–E, an elongate solder bump 321 of relatively uniform thickness can be provided on a rectangular wettable area 323 of substrate 325. When distributed uniformly as shown in FIGS. 12A–E, the solder bump 321 can have a hemispherical profile. The solder bump 321 can be heated uniformly above its melting temperature, for example, by heating the entire substrate in an oven or by generating a relatively uniform heat profile using the heater elements 319A–B to produce a solder profile similar to that illustrated in FIGS. 12A–E.

As shown in FIGS. 13A–E, the heater element 319B can be used to increase a temperature of the central portion of the liquid solder bump 321 with respect to the end portions of the solder bump. The resulting differences in surface tension across the solder bump 321 due to thermocapillarity can increase a thickness of the hottest portion of the liquid solder bump 321. Alternatively, one of the heater elements 319A or 319B can be used to increase a temperature of an end portion of the solder bump 321 with respect to the rest of the solder bump thereby increasing a thickness of the end portion of the solder bump with respect to the rest of the solder bump. As shown, a plurality of heater elements can be used to create different temperature profiles across the solder bump to thereby create different physical profiles of the solder.

While a larger number of heater elements can provide a greater control of the resulting shape of the solder bump, a single heater element could be used to selectively heat a selected portion of the solder bump. Moreover, one or more heater elements can be used together with environmental heating (such as from an oven) wherein the environmental heating, for example, is used to melt the solder and wherein one or more heater elements can provide different temperature profiles for the bump. Alternatively, means other than resistive heater elements could be used to provide a varying temperature profile.

Thermocapillarity can thus be used to vary a displacement exerted by a liquid bump on a component thereby effecting movement of the component. A central portion of the elongate solder bump 321 illustrated in FIGS. 12A–E and 13A–E, for example, could be position adjacent a component on the substrate 325, and an increase in the size of the central portion of the solder bump could be used to displace the component. Elongate solder bumps as illustrated in FIGS. 12A–E and 13A–E, for example, could be used in place of solder bumps 257, 267, 287A–B, or 307A–B of FIGS. 8–11. Moreover, elongate solder bumps as illustrated in FIGS. 12A–E and 13A–E can be used in combination with an adhesive such as solder or epoxy so that the adhesive flexibly secures the component while positioning and so that the adhesive rigidly secures the component once a desired position is achieved.

As shown in FIGS. 12A–E, a rectangular line coated with a hemispheric thickness of solder can have a uniform profile when uniformly heated above its melting temperature such that the solder is in an isothermal state. If additional heat is applied to center section, the surface tension of the center section can be reduced, and the radius of curvature can be reduced. Surface tension is discussed, for example, by N. K. Adam in *The Physics And Chemistry Of Surfaces* (Dover Publications, New York, 1968), the disclosure of which is hereby incorporated herein in its entirety by reference. In order for the radius of curvature to decrease the solder thickness of the warmer portion can become super-hemispheric and additional solder can flow into the warmer region, as shown in FIGS. 13A–E. This movement of liquid can be used to displace a component in contact therewith.

If the rectangular line is coated with a liquid that is sub-hemispheric on the wettable surface when in an isothermal state, the liquid may flow away from a warmer region to achieve a result that is opposite of that illustrated in FIGS. 12A–E and 13A–E. If, for example, heat is applied to the center section of the wetted surface, thereby decreasing the surface tension, then the liquid will flow away from the heat toward the cooler ends. In this situation, the radius of curvature can be increased in the heated region by lessening a height of the solder bump.

Calculations for a movement of solder as illustrated in FIGS. 12A–E and 13A–E are provided below. According to a particular example, an insulating portion of the substrate 325 adjacent the wettable area 323 may be an oxide having a thermal conductivity $\theta$ of 50.9 watt/(mK); the wettable area 323 of the substrate may have a length L=1 cm and a width W=0.25 mm; and the heater element 319B may have an electrical resistivity $\rho=0.146\times10^{-6}$ ohm-cm. At in initial uniform temperature $T_0$ across the elongate solder bump 321 of 233 C. (506 K), the elongate solder bump 321 can have an initial radius of curvature $r_0$ of 0.75 W (0.1875 mm) and an initial surface tension $\sigma_{T0}$ of 493 dyne/cm. The elongate solder bump can be heated to the initial temperature, for example, by heating the substrate in an oven or by generating a relatively uniform temperature profile across the bump using a plurality of heater elements 319A–C.

A temperature of the center portion of the elongate solder bump can be increased with respect to the end portions of the elongate solder bump by providing additional power to the central heater element 319B. The temperature of the center portion of the elongate solder bump, for example, can be increased to a second temperature $T_1$=280 C. (553 K) while maintaining end portions of the elongate solder bump at the initial temperature $T_0$=233 C. to provide a temperature differential $\Delta T$ of 47 K.

Assuming that the temperature gradient appears across a distance of G=0.2 L, the power P used to maintain a temperature differential of 47 K can be calculated as follows:

$$P = \Delta T * \theta * \pi * r_0^2 / (0.2 \, L) = 0.132 \text{ watt.}$$

The radius of curvature of the heated zone can be calculated as:

$$r_H = r_0 * \sigma_{T1} \sigma_{T0} = 178.753 \text{ μm, and}$$

$$\Delta r = r_H - r_0 = -8.747 \text{ μm.}$$

The pressure can be calculated as:

$$\text{Pressure} = 2\sigma_{T1}/r_H = 0.763 \text{ psi.}$$

While embodiments of FIGS. 12A–E and 13A–E are discussed by way of example using solder, other liquids such as epoxies and thermoplastics can be used.

According to additional embodiments of the present invention, asymmetry in the shape of the wetted surface can be used to cause changes in the distribution of the liquid in response to changes in surface tension. A first dimension of a first portion of a wettable surface area can be wide relative to a second dimension of a second portion of the wettable surface area so that uniform heating of the wettable surface area can cause redistribution of a liquid thereon.

Figure 14A:
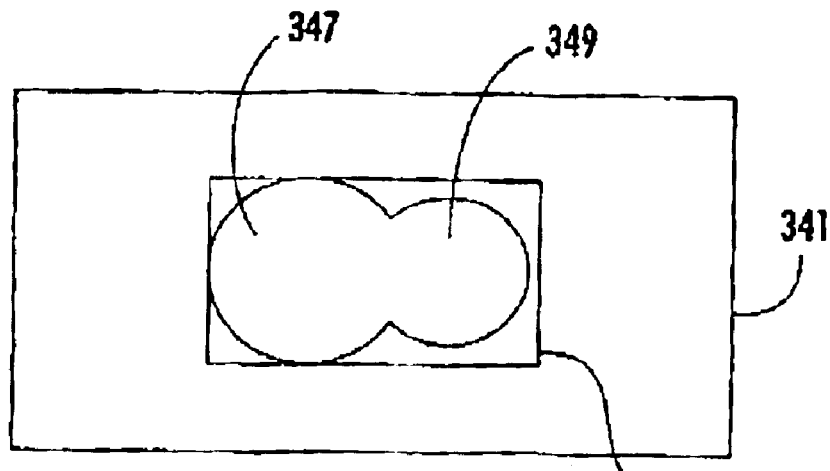
FIGS. 14A–C are plan and cross-sectional views illustrating movement of liquid on an asymmetric surface by changing a temperature of a uniformly heated liquid according to embodiments of the present invention.
Figure 14B:
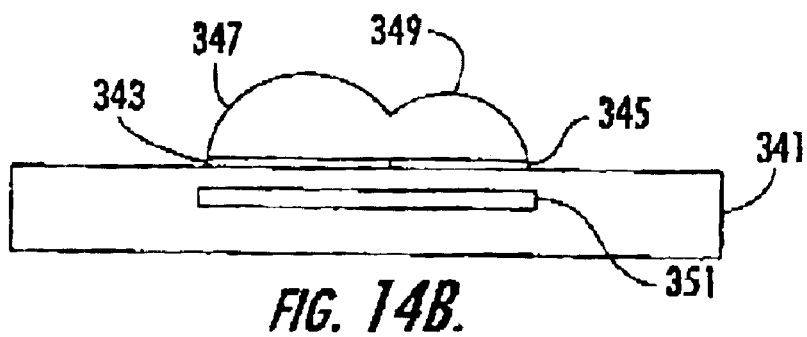
Figure 14C:
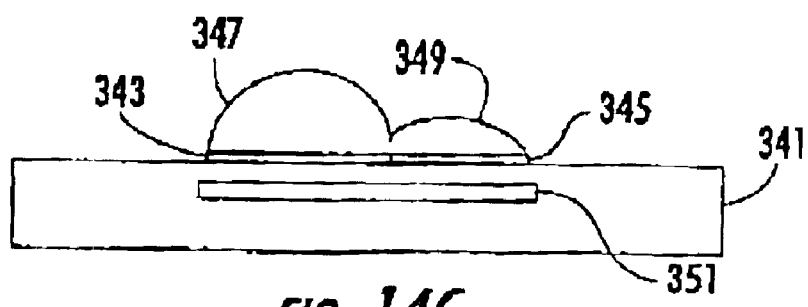

As shown in FIGS. 14A–C, a wettable surface area of a substrate 341 can have a first portion 343 having a first dimension that is wide relative to a second dimension of a second portion 345 of the wettable surface area. A liquid bump on the wettable surface area can have a corresponding first portion 347 that is wide relative to a second portion 349. The substrate 341 can also include a single heater element 351 used to uniformly heat both portions of the liquid bump. When heated to a temperature between the melting and boiling points of the liquid, the height of the first portion 347 of the liquid bump will be greater than the height of the second portion 349 as a result of surface tension provided that a uniformly applied gravitational force is maintained, for example, in a horizontal position.

The surface tension of a liquid can be varied, however, as a function of temperature so that the difference in heights can be varied by varying the temperature. As the temperature of the liquid bump increases, the surface tension will decrease so that the differences in height will be reduced with increasing temperature between the melting and boiling temperatures. As the temperature of the liquid bump decreases, the surface tension will increase so that the differences in height will be increased with decreasing temperatures between the melting and boiling temperatures. In other words, the liquid can have a relatively high surface tension at the melting temperature so that the pressure driving the liquid from the narrow portion 349 to the wide portion 347 is greatest at a temperature just above the melting temperature. Conversely, the liquid can have nearly zero surface tension at the boiling temperature so that the pressure driving the liquid from the narrow portion 349 to the wide portion 347 is least at a temperature just below the boiling temperature of the liquid.

A single heater element 351 can thus be used to vary the heights of the liquid bump including the wide portion 347 and the narrow portion 349. As shown in FIG. 14B, the liquid bump can be heated to a first temperature T1 between the melting and boiling points of the liquid so that surface tension induced pressures cause the wide portion 347 to have a greater height than the narrow portion 349. As shown in FIG. 14B, the difference in heights can be increased by heating the liquid bump to a second temperature T2 between the melting temperature and T1. The liquid bump can thus be used to displace a component as discussed above. Either the wide portion 347 or the narrow portion 349 can be provided adjacent a component as shown, for example, in FIGS. 3 or 8–11 to provide variable positioning of a component dependent on the temperature of the liquid bump. While a single heater element 351 is illustrated in FIGS. 14A–C, the liquid bump can be heated by other means such as an oven.

The use of differential heating and asymmetric surface area can also be used in combination to provide a bi-stability effect. If two portions of a liquid bump have different widths and are heated differently, the liquid bump will be stable as long as the wide and narrow portions of the liquid bump are sub-hemispheric. If a temperature differential is used to drive liquid from the wide portion to the narrow portion of the bump to the extent that the narrow portion becomes super-hemispheric, however, a meta-stable condition could be achieved so that a height of the narrow portion actually exceeds a height of the wide portion of the liquid bump.

Figure 16:
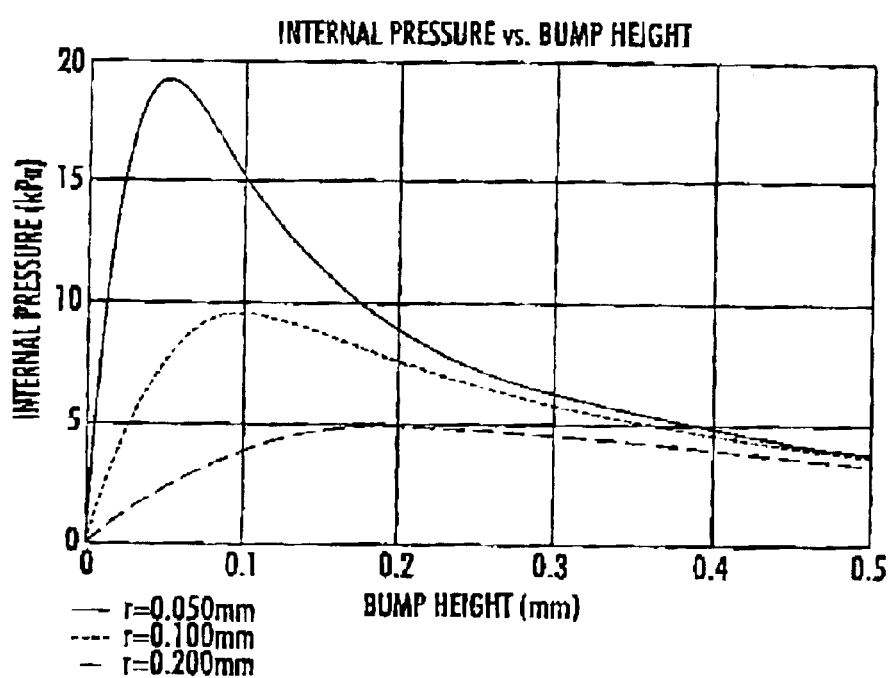
FIG. 16 is a graph illustrating internal pressure of a liquid as a function of liquid bump height.

Because an internal pressure for a liquid bump is highest for a hemisphere on a constrained surface, there is a discontinuity in the slope of the dp/dv curve. In the curve shown in FIG. 16, the internal pressure peaks when the radius of curvature of the bump is equal to the height of the bump (r=h) at which point the profile of the bump is a hemisphere. Therefore, if the liquid is made to move toward one end of the structure and the liquid at that end becomes super-hemispheric the system will switch to a new meta-stable state where most of the liquid moves to the end with lower pressure. If the new state is not too distant from the discontinuity, differential pressure caused by thermocapillarity could be used to switch back to the initial state.

Figure 15A:
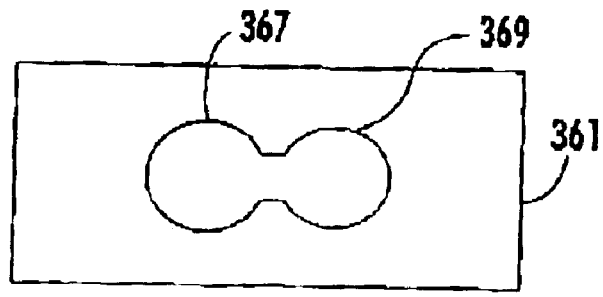
FIGS. 15A–C are plan and cross-sectional views illustrating movement of liquid on an asymmetric surface using a temperature differential across the liquid according to embodiments of the present invention.
Figure 15B:
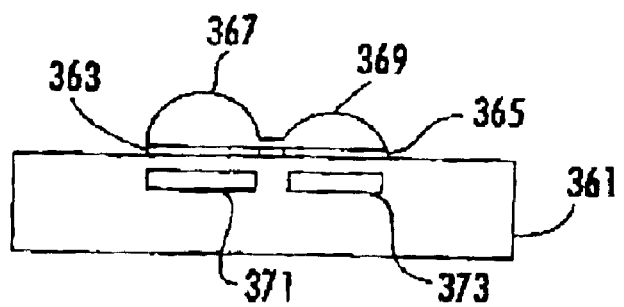
Figure 15C:
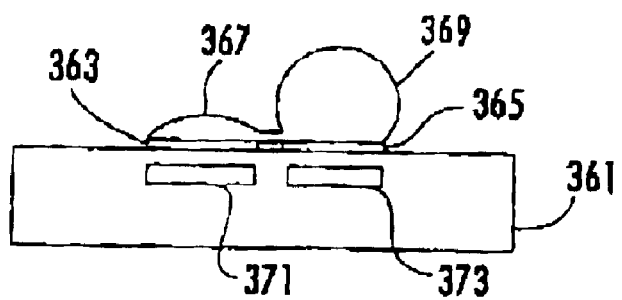

As shown in FIGS. 15A–C, a wettable surface area of a substrate 361 can have a first relatively wide portion 363 and a second relatively narrow portion 365, and the liquid bump thereon can have a corresponding wide portion 367 and a corresponding narrow portion 369. Heater elements 371 and 373 can be used to differentially heat the wide and narrow portions of the liquid bump.

As shown in FIG. 15B, if both the wide and narrow portions of the liquid bump are sub-hemispheric and heated to a common temperature between the melting and boiling temperatures of the liquid, the height of the wide portion 367 will be greater than a height of the narrow portion 369 as a result of surface tension. The heater elements 371 and 373 can be used to heat the narrow portion 369 to a temperature greater than that of the wide portion so that liquid flows from the wide portion 367 to the narrow portion 373. If enough liquid can be transferred from the wide portion to the narrow portion so that the radius of the narrow portion is greater than or equal to the height of the narrow portion, a meta-stable condition can be achieved so that the height of the narrow portion 369 is significantly greater than the height of the wide portion 367, as shown in FIG. 15C.

Once the condition of FIG. 15C is achieved, a temperature differential is not required to maintain the condition. In fact, a reverse temperature differential may be required to get liquid to flow from the narrow portion 369 back to the wide portion 367. The reverse temperature differential must be sufficient to overcome the pressure curve illustrated in FIG. 16. Moreover, the liquid bump in the meta-stable condition of FIG. 15C can be cooled to solidification while maintaining the relative heights of the wide and narrow portions.

Figure 17A:
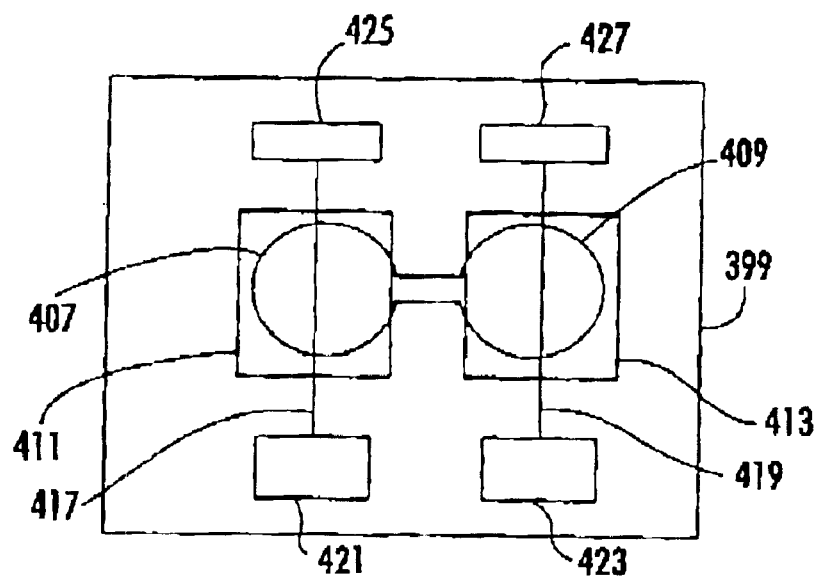
FIGS. 17A–C are plan and cross-sectional views illustrating movement of solder to switch light according to embodiments of the present invention.
Figure 17B:
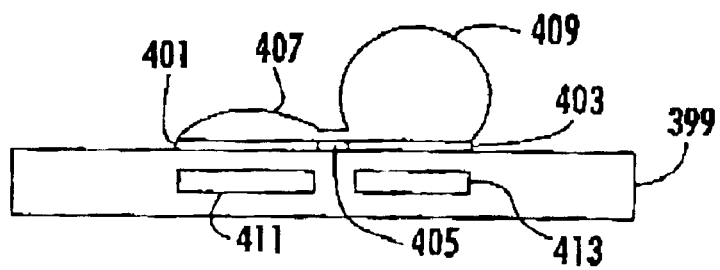
Figure 17C:
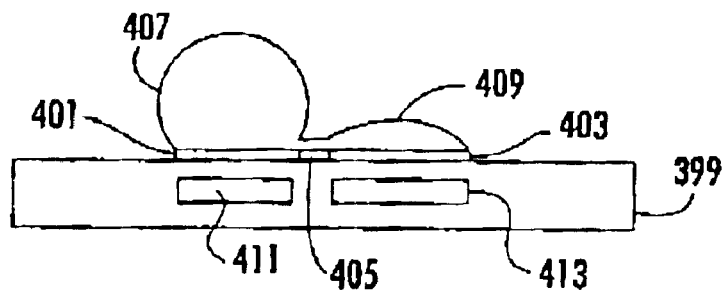

The meta-stable condition discussed above with regard to FIGS. 15A–C can also be used to move liquid between connected portions of equal surface area and surface dimensions as shown, for example, in FIGS. 17A–C. As shown in FIGS. 17A–C, a patterned wettable layer may include wettable areas 401 and 403 of equal surface area and a relatively narrow channel 405 therebetween on a substrate 399, and solder bumps 407 and 409 can be provided on the wettable areas 401 and 403. The substrate 399 can also include heater elements 411 and 413 therein to differentially heat the solder bumps 407 and 409.

The heater elements 411 and 413 can thus be used to differentially heat the solder bumps to alternatingly create the meta-stable condition of FIG. 17B where solder bump 409 is super-hemispheric and solder bump 407 has relatively little solder thereon and the meta-stable condition of FIG. 17C where solder bump 407 is super-hemispheric and solder bump 409 has relatively little solder thereon. As discussed above, the initial temperature differential used to achieve either meta-stable condition is not required to maintain the respective condition, and the solder can be cooled to solidification while maintaining either meta-stable condition.

The structure of FIGS. 17A–C can thus be used as a kind of a physical latch. Each solder bump 407 and 409 can thus be used to selectively interrupt or reflect a respective light path 417 and 419. The light path 417 between optical components 421 and 425 can be maintained in the meta-stable condition of FIG. 17B where relatively little solder is left for bump 407, and the light path 417 can be interrupted in the meta-stable condition of FIG. 17C where the solder bump 407 is super-hemispheric. Conversely, the light path 419 between optical components 423 and 427 can be interrupted in the meta-stable condition of FIG. 17B where the solder bump 409 is super-hemispheric and the light path 419 can be maintained in the meta-stable condition of FIG. 17C where relatively little solder is left for bump 409.

Instead of merely interrupting a light path between two optical components, a liquid bump can alternatively be used to selectively maintain a light path between first and second components or to provide a reflected light path between the first component and a third component depending on the size of the bump. A liquid bump can also be used to selectively provide one of a plurality of reflected light paths depending on the size of the bump.

While two light paths are illustrated in FIGS. 17A–B, a single light path could be manipulated with one of the solder bumps. Moreover one or both of the liquid bumps could be used to position components on a substrate instead of or in addition to modulating a light path. Moreover, a light path could be manipulated using liquid movements other than those illustrated in FIGS. 17A–C. Liquid movements according to any of the techniques discussed above could be used to manipulate a light path.

If the liquid is initially equally distributed between the portions and the profile is initially sub-hemispheric on each portion, a temperature differential can be used to make liquid flow from a first portion to the second portion. If enough liquid can be caused to flow such that the second portion reaches a hemispheric profile, the meta-stable condition can be obtained such that liquid will not flow back to the first portion without applying a reverse temperature differential of sufficient magnitude to the system. With two ends of equal wetted area there would be no preferred end and the switching can be more uniform. The moving liquid could be used to block a beam of light or exert a force to move a component.

In the examples discussed above, a liquid bump can be solder or other liquid materials such as epoxies, thermoplastics, oleic acid, etc. In the case of epoxies, the curing by chemical or UV radiation could harden the liquid in a desired position. The component being positioned could be supported by liquid solder or epoxy during the positioning and subsequently solidified when proper position is attained. In this instance, the motive liquids need not undergo a phase transition to secure the component in position.

If the liquid is electrically conductive, the surface tension can be varied by the applications of voltage to the liquid with respect to the substrate or a surrounding electrolyte, thus producing effects similar to those of thermocapillarity. The use of voltage to vary surface tension is discussed, for example, by A. Frohn et al. in *Dynamics of Droplets* (Springer Verlag, N.Y., 2000), the disclosure of which is incorporated herein in its entirety by reference.

Liquid bumps can be used as discussed above to provide precise positioning of components. For example, a liquid bump can be used as a prime mover to position a component during an assembly of an electronic, optical, and/or mechanical system after which the component is maintained in the assembled position. Liquid bumps can also be used to provide continuous dynamic alignment during and/or after use of such an assembly. Liquid bumps, for example, can be used as liquid prime movers to manipulate mirrors and/or lasers and/or to selectively interrupt and/or deflect an optical path during use of an optical system. Alternatively, liquid prime movers can be used to reposition a component of a system after some period of use to compensate for effects of aging and/or use.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of positioning a component on a substrate, the method comprising:
   providing an adhesive material that adheres the component to the substrate wherein the adhesive material is provided in a first state that allows movement of the component relative to the substrate wherein the liquid material and the adhesive material are physically separated;
   after providing the adhesive material, providing a liquid material on the substrate adjacent the component such that the component has a first position relative to the substrate;
   changing a property of the liquid material while in a liquid state to move the component from the first position relative to the substrate to a second position relative to the substrate while the liquid material is maintained in a liquid state; and
   after providing the liquid material and changing the property of the liquid material, changing the adhesive material to a second state to secure the component in the second position relative to the substrate.

2. A method according to claim 1 wherein changing the adhesive material to the second state comprises changing the adhesive material to the second state while maintaining the liquid material in a liquid state.

3. A method according to claim 1 further comprising:
   after changing the adhesive material to the second state, changing a state of the liquid material to a solid while maintaining the component in the second position relative to the substrate.

4. A method according to claim 1 wherein the adhesive material comprises curable epoxy and wherein changing the adhesive material to the second state comprises curing the curable epoxy.

5. A method according to claim 1 wherein the adhesive material comprises solder, wherein the first state of the adhesive material is liquid solder and wherein changing the adhesive material to the second state comprises changing liquid solder to a solid solder.

6. A method according to claim 1 wherein changing the property of the liquid material comprises changing a surface tension of the liquid material.

7. A method according to claim 1 wherein changing the property of the liquid material comprises changing an internal pressure of the liquid material.

8. A method of positioning a component on a substrate, the method comprising:
   providing a liquid material on the substrate adjacent the component such that the component has a first position relative to the substrate; and
   changing a property of the liquid material while in a liquid state to move the component from the first position relative to the substrate to a second position relative to the substrate while the liquid material is maintained in a liquid state wherein changing the property of the liquid material comprises changing volume of the liquid material by providing additional liquid material on the wettable area of the substrate adjacent the component.

9. A method according to claim 8 further comprising:
   after providing the liquid material and changing the property of the liquid material, securing the component in the second position relative to the substrate.

10. A method of positioning a component on a substrate, the method comprising:
    providing a liquid material on the substrate adjacent the component such that the component has a first position relative to the substrate; and
    changing a property of the liquid material while in a liquid state to move the component from the first position relative to the substrate to a second position relative to the substrate while the liquid material is maintained in a liquid state wherein changing the property of the liquid material comprises changing an electrical potential of the liquid material.

11. A method of positioning a component on a substrate, the method comprising:
    providing a liquid material on the substrate adjacent the component such that the component has a first position relative to the substrate; and
    changing a property of the liquid material while in a liquid state to move the component from the first position relative to the substrate to a second position relative to the substrate while the liquid material is maintained in a liquid state wherein changing the property of the liquid material comprises heating different portions of the liquid material to different temperatures.

12. A method according to claim 1 wherein changing the property of the liquid material comprises changing a pressure exerted by the liquid material against the component.

13. A method of positioning a component on a substrate, the method comprising:
providing a liquid material on the substrate adjacent the component such that the component has a first position relative to the substrate; and
changing a property of the liquid material while in a liquid state to move the component from the first position relative to the substrate to a second position relative to the substrate while the liquid material is maintained in a liquid state wherein changing the property of the liquid material comprises changing a fluid in contact with the liquid material while the liquid material is maintained in a liquid state.

14. A method of positioning a component on a substrate, the method comprising:
providing a liquid material on the substrate adjacent the component such that the component has a first position relative to the substrate; and
changing a property of the liquid material while in a liquid state to move the component from the first position relative to the substrate to a second position relative to the substrate while the liquid material is maintained in a liquid state wherein changing the property of the liquid material comprises changing a gas in contact with the liquid material.

15. A method of positioning a component on a substrate, the method comprising:
providing a liquid material on the substrate adjacent the component such that the component has a first position relative to the substrate; and
changing a property of the liquid material while in a liquid state to move the component from the first position relative to the substrate to a second position relative to the substrate while the liquid material is maintained in a liquid state;
wherein the liquid material is constrained on a wettable area of the substrate wherein the wettable area includes a first portion having a first dimension and a second portion having a second dimension, wherein changing the property of the liquid material comprises changing a temperature of the liquid material.

16. A method according to claim 1 wherein the component comprises an optical fiber, a laser, a lens, and/or a light emitting diode.

17. A method according to claim 1 wherein the second position is a desired position for the component.

18. A method of positioning a component on a substrate, the method comprising:
providing an initial volume of liquid on a wettable area of the substrate adjacent the component such that the component has a first position relative to the substrate;
changing the volume of the liquid on the wettable area of the substrate adjacent the component by providing additional liquid on the wettable area of the substrate adjacent the component to move the component from the first position relative to the substrate to the second position relative to the substrate while maintaining the liquid in a liquid state; and
after providing the initial volume of the liquid and changing the volume of the liquid, securing the component in the second position relative to the substrate.

19. A method according to claim 18 wherein securing the component comprises cooling the liquid below the melting temperature thereof to solidify the liquid.

20. A method according to claim 18 wherein changing the volume of the liquid comprises increasing the volume of the liquid on the wettable area.

21. A method according to claim 18 wherein providing the initial volume of the liquid comprises providing the initial volume of the liquid on the wettable area of the substrate and providing a reservoir of liquid on a second wettable area, and wherein changing the volume of the liquid on the first wettable area comprises moving liquid from the reservoir to the first wettable area.

22. A method of positioning a component on a substrate, the method comprising:
providing an initial volume of liquid on a wettable area of the substrate adjacent the component such that the component has a first position relative to the substrate;
changing the volume of the liquid on the wettable area of the substrate adjacent the component to move the component from the first position relative to the substrate to the second position relative to the substrate; and
after providing the initial volume of the liquid and changing the volume of the liquid, securing the component in the second position relative to the substrate;
wherein providing the initial volume of the liquid comprises providing the initial volume of the liquid on the wettable area of the substrate and providing a sump comprising a second wettable area, and wherein changing the volume of the liquid on the first wettable area comprises moving liquid from the first wettable area to the sump.

23. A method of positioning a component on a substrate, the method comprising:
providing an initial volume of liquid on a wettable area of the substrate adjacent the component such that the component has a first position relative to the substrate;
changing the volume of the liquid on the wettable area of the substrate adjacent the component to move the component from the first position relative to the substrate to the second position relative to the substrate while maintaining the liquid in a liquid state; and
after providing the initial volume of the liquid and changing the volume of the liquid, securing the component in the second position relative to the substrate;
wherein the component comprises an optical fiber, a laser, a lens, and/or a light emitting diode.

24. A method of positioning a component on a substrate, the method comprising:
providing liquid material on substrate adjacent the component wherein the liquid material is confined to a wettable area of the substrate such that the component is in a first position relative to the substrate; and
differentially heating the liquid material confined to the wettable area of the substrate to move the component from the first position to a second position relative to the substrate while the liquid material is maintained in a liquid state.

25. A method according to claim 24 wherein the component comprises an optical fiber, a laser, a lens, and/or a light emitting diode.

26. A method according to claim 24 wherein the wettable area of the substrate is surrounded by an area of the substrate that is non-wettable to the liquid material.

27. A method according to claim 22 wherein the component comprises an optical fiber, a laser, a lens, and/or a light emitting diode.

28. A method according to claim 1 wherein the component comprises an optical component and/or an electronic component.

29. A method according to claim 18 wherein the component comprises an optical component and/or an electronic component.

30. A method according to claim 24 wherein the component comprises an optical component and/or an electronic component.

31. A method according to claim 1 further comprising:

before changing the property of the liquid material, providing an adhesive material that adheres the component to the substrate wherein the adhesive material is provided in a first state that allows movement of the component relative to the substrate wherein the liquid material and the adhesive material are physically separated; and after changing the property of the liquid material, changing the adhesive material to a second state to secure the component in the second position relative to the substrate.

32. A method according to claim 18 wherein the component comprises an optical fiber, a laser, a lens, and/or a light emitting diode.

33. A method according to claim 15 wherein first dimension is greater than the second dimension such that the first portion of the wettable area is wide relative to the second portion of the wettable area.

34. A method according to claim 15 wherein the wettable area is asymmetric.

* * * * *